(12) United States Patent
Aggarwal et al.

(10) Patent No.: US 6,701,509 B2
(45) Date of Patent: Mar. 2, 2004

(54) INTEGRATED CIRCUIT POWER AND GROUND ROUTING

(75) Inventors: Lily Aggarwal, Santa Clara, CA (US); Linda Ann Barnhart, San Martin, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 70 days.

(21) Appl. No.: 10/053,423

(22) Filed: Nov. 9, 2001

(65) Prior Publication Data

US 2002/0093036 A1 Jul. 18, 2002

Related U.S. Application Data

(62) Division of application No. 09/371,371, filed on Aug. 10, 1999, now Pat. No. 6,858,332.

(51) Int. Cl.⁷ .............................................. G06F 17/50

(52) U.S. Cl. ............................ 716/13; 716/10; 716/14

(58) Field of Search .............................. 716/13, 14, 10

(56) References Cited

U.S. PATENT DOCUMENTS

| | | | | |
|---|---|---|---|---|
| 4,811,237 A | * | 3/1989 | Putatunda et al. ............... | 716/9 |
| 5,596,506 A | * | 1/1997 | Petschauer et al. ............. | 716/5 |
| 5,754,826 A | * | 5/1998 | Gamal et al. ................... | 703/14 |
| 5,818,728 A | * | 10/1998 | Yoeli et al. ..................... | 716/16 |
| 5,822,214 A | * | 10/1998 | Rostoker et al. ............... | 716/10 |
| 5,972,740 A | * | 10/1999 | Nakamori ..................... | 438/129 |
| 6,058,257 A | * | 5/2000 | Nojima ......................... | 716/12 |
| 6,182,272 B1 | * | 1/2001 | Andreev et al. ............... | 716/13 |
| 6,202,196 B1 | * | 3/2001 | Huang et al. .................. | 716/14 |
| 6,305,000 B1 | * | 10/2001 | Phan et al. ..................... | 716/5 |

(List continued on next page.)

FOREIGN PATENT DOCUMENTS

| | | | | | |
|---|---|---|---|---|---|
| GB | 2215121 A | * | 9/1989 | ........... | H01L/23/50 |
| JP | 03094452 A | * | 4/1991 | ........... | H01L/23/06 |
| JP | 04269851 A | * | 9/1992 | ........... | H01L/21/82 |
| JP | 06084913 A | * | 3/1994 | ....... | H01L/21/3205 |

OTHER PUBLICATIONS

NN79102018, "Circuit Layout Technique For Custom LSI Components", IBM Technical Disclosure Bulletin, vol. 22, No. 5, Oct. 1979, pp. 2018–2020 (5 pages).*

Amazawa et al. , "Fully planarized four–level interconnection with stacked vias using CMP of selective CVD–Al and insulator and its application to quarter micron gate array LSIs", International Electron Devices Meeting, Dec. 10, 1995, pp. 473–476.*

Katsadas et al., "A multi–layer router utilizing over–cell areas", Proceedings of 27th ACM/IEEE Design Automation Conference, Jun. 24, 1990, pp. 704–708.*

*Primary Examiner*—Matthew Smith
*Assistant Examiner*—Phallaka Kik
(74) *Attorney, Agent, or Firm*—Peter Zawilski

(57) ABSTRACT

An integrated circuit includes a plurality of blocks of cells, and a plurality of layers with conductors for signal and power routing. Power and ground connections for individual cells are supplied by power and ground conductors in a first layer of conductors at the cell level. Power and ground conductors at the block level are supplied by power and ground conductors at the top level of the layers which are connected to the first layer power and ground conductors by stacked vias. Intervening layers of conductors can be used for signal routing. This routing technique improves circuit density as compared to prior techniques where the block level power and ground conductors were in a second, lower level of conductors instead of a top level. A layout method is also disclosed in which the conductors for signal routing are defined in dependence on the placement of the block level power and ground conductors.

8 Claims, 6 Drawing Sheets

U.S. PATENT DOCUMENTS

| | | | | |
|---|---|---|---|---|
| 6,308,307 B1 | * | 10/2001 | Cano et al. | 716/8 |
| 6,336,207 B2 | * | 1/2002 | Shinomiya et al. | 716/11 |
| 6,338,972 B1 | * | 1/2002 | Sudhindranath et al. | 438/14 |
| 6,353,918 B1 | * | 3/2002 | Carothers et al. | 716/8 |
| 6,457,157 B1 | * | 9/2002 | Singh et al. | 716/2 |
| 6,480,989 B2 | * | 11/2002 | Chan et al. | 716/8 |
| 6,502,225 B2 | * | 12/2002 | Ishikura | 716/7 |
| 6,581,201 B2 | * | 6/2003 | Cano et al. | 716/12 |
| 6,594,811 B2 | * | 7/2003 | Katz | 716/12 |
| 6,594,813 B1 | * | 7/2003 | Gandhi et al. | 716/17 |
| 6,611,943 B2 | * | 8/2003 | Shibata et al. | 716/1 |
| 6,611,950 B2 | * | 8/2003 | Ishikura | 716/7 |
| 2001/0049813 A1 | * | 12/2001 | Chan et al. | 716/8 |
| 2001/0049815 A1 | * | 12/2001 | Shinomiya et al. | 716/11 |
| 2002/0013931 A1 | * | 1/2002 | Cano et al. | 716/1 |
| 2002/0046390 A1 | * | 4/2002 | Ferguson et al. | 716/14 |
| 2002/0083404 A1 | * | 6/2002 | Ishikura | 716/7 |
| 2002/0157082 A1 | * | 10/2002 | Shau | 716/19 |

* cited by examiner

INTEGRATED CIRCUIT POWER AND GROUND ROUTING

CROSS REFERENCE TO RELATED APPLICATIONS

This is a divisional of application Ser. No.09/371,371, filed Aug. 10, 1999 now U.S. Pat. No. 6,388,332.

BACKGROUND OF THE INVENTION

1. Field of the Invention

The invention relates to integrated circuits and, more particularly, to the routing of conductors in an integrated circuit to supply power and signals to circuitry therein.

2. Description of the Prior Art

Integrated circuits ("IC's") include circuitry which is typically organized in a hierarchical fashion of "cells" and "blocks" of cells. Each cell will include a large plurality of circuit elements such as transistors, resistors and capacitors to carry out a particular elementary function. The cells are then grouped into circuit "blocks", and the IC will have a large number of circuit blocks. IC's use multiple levels of conductors for distributing power and signals from off the IC to the circuit blocks within the IC, between the circuit blocks, and between the cells within each circuit block.

The conductors are formed by lithographically patterning a layer of conductive material to form conductive lines as viewed from above the IC substrate. The conductive layers with conductive lines formed, therein are separated by an insulating layer so that lines of one layer which cross another layer (when viewed from above) do not physically or electrically contact each other. When it is desired to electrically connect a conductor formed in one layer to a conductor formed in another layer, a conductive path is formed extending through the insulating layer between the two conductors. This conductive path is known in the integrated circuit art as a "via". The conductive layers are typically a metal, most commonly aluminum, but also include tungsten, copper and titanium and various alloys thereof Other materials are also known, such as metal silicides, metal nitrides and doped polysilicon. The insulating layer is commonly a dielectric material such as silicon dioxide.

The layers typically have different resistivities, with the lowest level (layer 1) having the highest resistivity and the highest level having the lowest resistivity. This is due to technological processing constraints such as smaller thickness at the lower layers. The different resistivities have influenced routing, with the higher resistivity, lower layers generally being used to make connections which are relatively close (e.g. within cells or blocks) while the higher level, lower resistivity layers are used to make longer connections, such as between points in different blocks.

The layout of the conductors has developed to a high degree and various software tools are available to automate the layout process with the input and guidance of the layout engineer. Factors which complicate and affect the layout include the impact of the chosen routing signal propagation with respect to signal timing between various cells and blocks, the impact of the routing on circuit density, and undesirable voltage drops along long conductor runs. The number of conductor layers also affects signal routing. As IC geometries have shrunk, the number.of available layers has increased from three to five, and the number of layers commonly used is expected to further increase.

FIGS. 1–3 illustrate the layout of conductive lines in an integrated circuit employing five conductive layers according to a common approach. For sake of simplicity, and because the conductors need not be limited to metals, the conductive layers in which the conductive lines are formed will be referred to herein as "layer 1", "layer 2", "layer 3", "layer 4" and "layer 5". Layer 1 is closest to the substrate, wit layers 1, 2 and 3 being referred to as "low level" layers and layers 4 and 5 being referred to as "high level layers". Individual conductor lines, or simply "conductors", will bear reference numerals in the form "XYY", with the digit X corresponding to the layer level in which that conductor resides. i.e. conductor 301 is in layer 3 and conductor 501 is in layer 5. Additionally, vias will be referred to with the legend "XZYY", with the digits X and Z referring to the upper and lower, respectively, conductive layers which that via connects.

FIG. 1 is a top view of a standard cell 12. Within the cell 12 are numerous circuit elements as, discussed above. Along the opposing edges 12a, 12b of the cell are conductors 101, 103 lithographically formed from a layer 1. These horizontally extending conductors, known in the art as "rails", are used to connect the cell 12 to a source of electric potential vdd! (rail 101) and to a lower source of potential, such as ground "gnd!" by rail 103. Connections between individual circuit elements as well as between circuit elements and the respective rail 101 or 103 may also be in layer 1.

FIG. 2 shows a portion of a "block" of cells. The block 20 includes cells 10, 11, 12, 13. In practice, a block of cells would typically include many more cells (such as one thousand cells). Generally speaking, each block of cells is "self-contained" in that it has input/output contacts in the form of conductive pads ("pins") which are connected to other blocks on the IC to electrically connect them together. Additionally, the blocks typically abut each other on all sides to maximize density. Here, the lower row of cells 10, 11 is bounded by another rail 105, in this case a power rail. Also shown, are conductors 202, 204, 206, 208 extending orthogonal to the rails 101, 103 and 105 and formed from a conductive layer 2 in a plane above and parallel to the layer 1 from which the rails 101–105 were formed. The conductors 202, 204, 206, 208 are known in the art as "stripes" and alternate in a similar manner as the rails with respect to connection to power (vdd!) and ground (gnd!). The ground stripes 204, 208 are connected to ground rail 103 by respective vias 2101 and 2102. The power stripes 202, 206 are connected to the power rails 101, 103 by respective vias 2103, 2104, 2105, 2106.

Typically, in a five layer system, the interconnection between blocks for signal routing is done in layer 5. Additionally, the power and ground conductors which distribute power across the IC from an off chip source of potential to the various blocks of cells are also in layer 5. The supply of power to the blocks, the supply of signals to and from the blocks, and the supply of signals between the blocks is known as the "top-level" design. Power and ground conductors at the cell level are in layer 1 while power and ground connections at the block level are in layers 2, 3, as illustrated in FIG. 2. Signal routing within a block is done in layers 3, 4. (not shown).

The layout design of an IC is typically done in a hierarchical fashion, starting from the cell level, moving to the block level and then the top level. The blocks are conventionally designed by a plurality of designers using the same software layout tools in a parallel fashion. When the block layouts are completed, the top level layout is then designed.

One problem with this layout approach of using conductors in layer 2 for power and ground delivery at the block level is that this allows access to the contact pins of each cell for from layer 1 only. Use of layer 1 for signal routing over anything more than very short distances makes it difficult to achieve proper signal timing because of its high resistivity. Cells cannot be placed under the layer 2 stripes 202, 204, 206, 208 of FIG. 2, because doing so would require the use of metal 1 for signal routing. FIG. 3 is a view of the area of block 20 around the stripes 202, 204. Instead of showing only four cells as in FIG. 2, FIG. 3 illustrates many more cells arranged in rows R1–RN. Under the stripes 202, 204 it is quite evident that there is significant chip area under these stripes which does not contain cells. This wasted space thus reduces the circuit density of the IC and increases its cost.

Conventionally, vias extend only vertically between layers, i.e. orthogonal to the stripes and rails. This poses a problem when trying to connect a top level power or ground conductor to a power/ground rail in layer 2, as it requires the use of "stacked" vias. A "stacked" via is a via that connects multiple layers. To connect from layer 5 to layer 2 requires a stack of three vias, i.e. a first via from a conductor in layer 5 to a conductor below it in layer 4, a second via from that conductor in layer 4 to a conductor below it in layer 3 and third via from the layer 3 conductor to a layer 2 conductor, with the vias being aligned. However, since the block level signal routing is in layers 3, 4, the stacked via cannot be put wherever there is an intervening signal conductor in layers 3, 4. One reason that this is problematic is that due to the bottom-up hierarchical design approach, the signal routing in layers 3, 4 is already in place before the top level designer starts routing the top level power and ground conductors. Another reason is that the sheer number of signal routing conductors in layers 3 and 4 does not leave much access area for the stacked vias necessary to connect layer 5 to layer 2. Thus, the large number of signal conductors in layers 3, 4 creates a pre-existing, tightly packed maze of signal conductors in these two layers between layers 5 and 2 that typically makes it impracticable to make subsequent connections from a power or ground conductor at the top level to an associated power or ground conductor in layer 2 at the block level.

One solution to this problem has been the use of "rings" each formed near the periphery of a block. FIG. 4 shows a top view of a portion of an integrated circuit showing a number of blocks 20, 21, 22, 23 each with a respective power rings 40, 41, 42, 43. Ring 40 includes conductors 210, 212 in layer 2 and conductors 311, 313 in layer 3. Ring 41 of block 21 includes conductors 214, 216, conductor 313 and conductor 315. Power rails 501, 503 bound the blocks at the upper and lower sides of the four blocks shown. Layer 4 stripes 402, 404, 406 extend between the power rails 501, 503. Vias connect the rails 501, 503 to the stripes 402, 404, 406. These level 4 stripes are connected to the rails 311, 313, 315 by vias, which level 3 rails are also connected with vias to the conductors 210, 212. In this manner, a power ring 40 is formed for block 20 by the conductors 210, 212 and the portions of the conductors 311, 313 between conductors 210, 212, and this ring is connected to vdd! by the rails 501, 503 and conductors 402, 404. The other rings 41, 42, 43 are connected to the supply potential vdd! in a similar manner. Power would be distributed to the individual cells from the ring 41, for example, by dropping vias from the conductors 210, 212 to the level 1 rails running along the cell edge as in FIG. 1. In FIG. 4, only the power ring is shown. A corresponding ground ring would be adjacent each of the power rings 41–43, for example inside or outside of these power rings.

One problem with the use of rings is that power is generally not distributed evenly to the cells within a block because the cells are not equally spaced from the ring. Cells near the middle of the block are further away than cells near the periphery of the block. More even distribution could be achieved by adding more layer 2 stripes, but because cells cannot be placed under layer 2 power or ground conductors as already discussed, such additional layer 2 conductors would merely exacerbate the loss of cells in the block and even further reduce circuit density.

SUMMARY OF THE INVENTION

According to the invention, the above disadvantages of the prior art are overcome in an integrated circuit having a plurality of cells of circuit elements defining a cell layer, conductors disposed in a plurality of layers adjacent the cell layer, and vias connecting conductors in a layer to conductors in other layers. The number of layers of conductors is N, N being four or greater, the first layer being next to the cell level and the Nth layer being remote from the cell level. Each cell has a cell border and is connected to a respective power and ground conductor in a first layer adjacent the cell border. Power and ground conductors extend across the cells in at least one of the N and N-1 layers and stacked vias connect the power and ground conductors of the at least one of N and N-1 layers to respective power and ground conductors of the first layer.

Placement of the block level power and ground conductors in the top two layers of conductors, instead of in the lower level layers has been found to significantly increase circuit density. This is primarily due to the ability to place cells under the high level layer, power and ground conductors, avoiding the cell loss problem under layer 2 power and ground conductors as in the prior art. Additionally, power and ground rings in low level layers and their attendant disadvantages are avoided.

Another aspect of the invention concerns a method of laying out the conductors of an IC to place the block level power and ground conductors in the high level conductor layers.

Yet another aspect of the invention concerns a method of laying out the conductors of an IC by placing signal routing, power or ground conductors within the lower level layers in dependence on the prior designation of the placement of the power or ground conductors for the block and top levels in the top level layers. Favorably, a grid of power and ground conductors is placed at the top level which defines the size and placement of blocks of cells on the IC. Also, the signal routing conductors may be placed after placement of the vias which connect the top level power and ground conductors to the first level power and ground conductors. Generally speaking, this method is a top-down approach, as opposed to the commonly used bottom-up approach, and places priority on layout of the power supply conductors over that of signal routing conductors. In addition to increased circuit density, the inventors have found this approach reduces the design cycle as well, as it is easy to connect block level power and ground conductors to the top level power and ground conductors. There is no need to make connections from all the four sides of the block at the top level, which consumed a significant amount of time within the prior approach.

These and other object, features and advantages of the invention will become apparent with reference to the following detailed description and the drawings.

DESCRIPTION OF THE PREFERRED EMBODIMENTS

Figure 1:
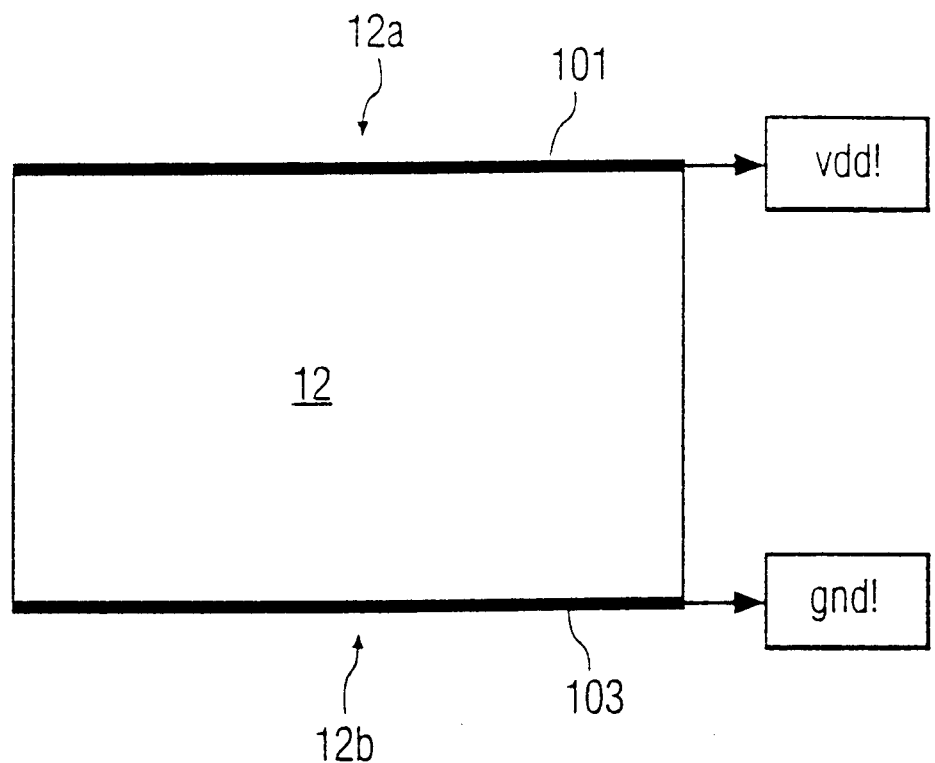
FIG. 1 is a top, diagrammatic view of a cell of circuit elements of an integrated circuit according to the prior art.
Figure 5:
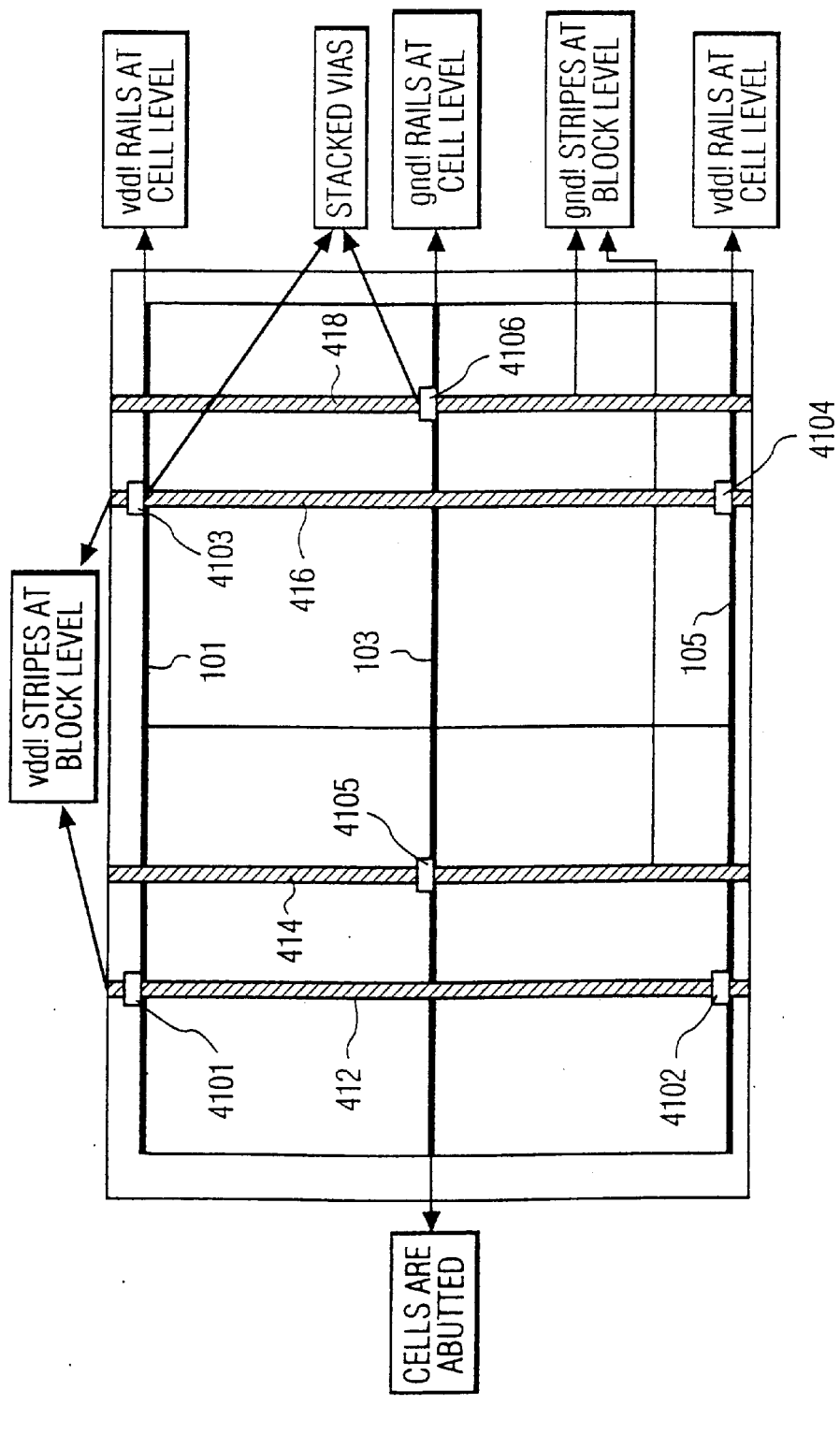
FIG. 5 is a top, diagrammatic view of a portion of a block of cells illustrating power and ground conductor routing according to the invention.
Figure 6:
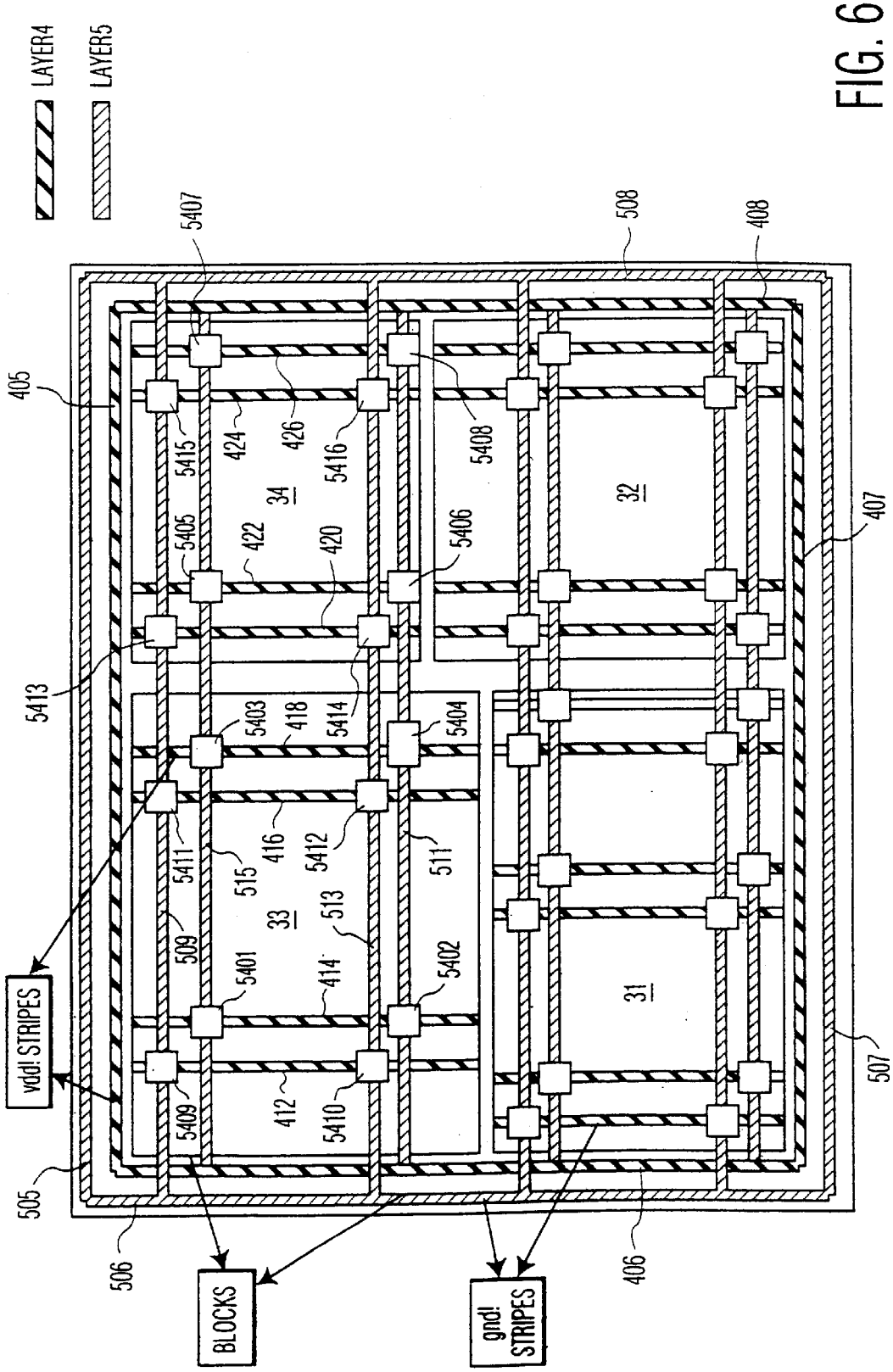
FIG. 6 is a top, diagrammatic view showing a number of blocks of cells and conductor interconnections according to the invention.

FIGS. 5 and 6 illustrate the improved routing of power and ground conductors according to the invention. The invention is illustrated in the context of an IC with five conductive layers, although the invention is applicable to ICs with more than five layers. Elements corresponding identically to those in previous Figures bear the same reference numbers. At the cell level, the alternating power and ground rails 101, 103, 105 remain as illustrated previously in FIG. 1.

Figure 2:
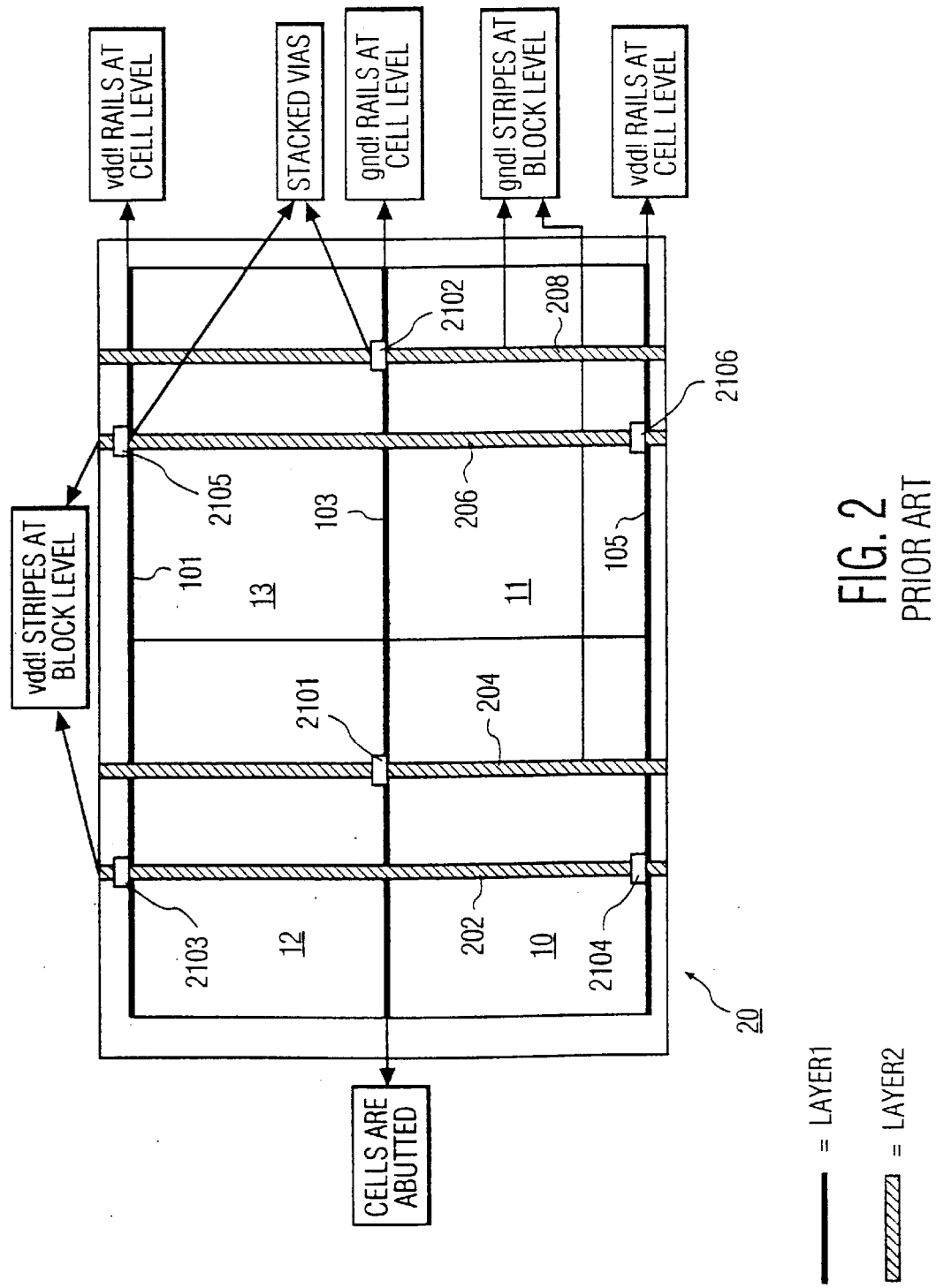
FIG. 2 is a top, diagrammatic view of a portion of a block of cells according to the prior art.

In FIG. 5, the block level routing has the power and ground stripes at layer 4 instead of in layer 2 as in the prior art FIG. 2. The power stripes 412, 416 are connected to the power rails 101, 105 through stacked vias 4101, 4102, 4103 and 4104. Each stacked via consists of a first via between layer 4 and layer 3, a second via between layer 3 and layer 2 and a third via between layer 2 and layer 1. The ground stripes 414, 418 are similarly connected to the ground rail 103 by vias 4105, 4106. To appreciate the scale, by way of example only, consecutive power stripes 412, 416 may be spaced from each other by a distance on the order of 400 microns while the spacing between adjacent power stripe 412 and ground stripe 414 may be approximately 7–8 microns.

FIG. 6 shows the "top level" interconnection of various blocks, 31, 32, 33, 34, each constructed according to FIG. 5. At the periphery of all the blocks (31–34), a ground ring is formed in layer 5 by conductors 505, 506, 507, 508. Also at the periphery of all of the blocks is a power ring formed in layer 4 by conductors 405, 406, 407, 408. Extending across blocks 33 and 34 are rails 509, 513 between the ground conductors 506, 508, as well as rails 511, 515 between power conductors 406, 408. Within block 33, power is supplied to stripes 414 and 418 by reason of the vias 5401, 5402 and 5403, 5404 which connect these stripes to the power rails 511, 515. Within block 34, power is supplied to stripes 422 and 426 from rails 511, 515 by vias 5405, 5406, 5407, 5408. Similarly, in blocks 33, 34 the stripes 412, 416, 420 and 424 are coupled to the ground rails 509, 513 by respective vias 5409–5416. The power and ground connections to blocks 31 and 32 are made in the same manner as for blocks 33 and 34, so will not be further described. Note that while the present embodiment uses rings for power and ground, that these rings are at the top level and not at the block level, and that the rings at the block level are no longer necessary.

Note that the power and ground stripes are both in the same layer, as are the power and ground rails in a same, but different layer. While the power ring and the stripes are shown in layer 4 and the ground ring and the rails are shown in layer 5, they could easily be reversed.

Figure 3:
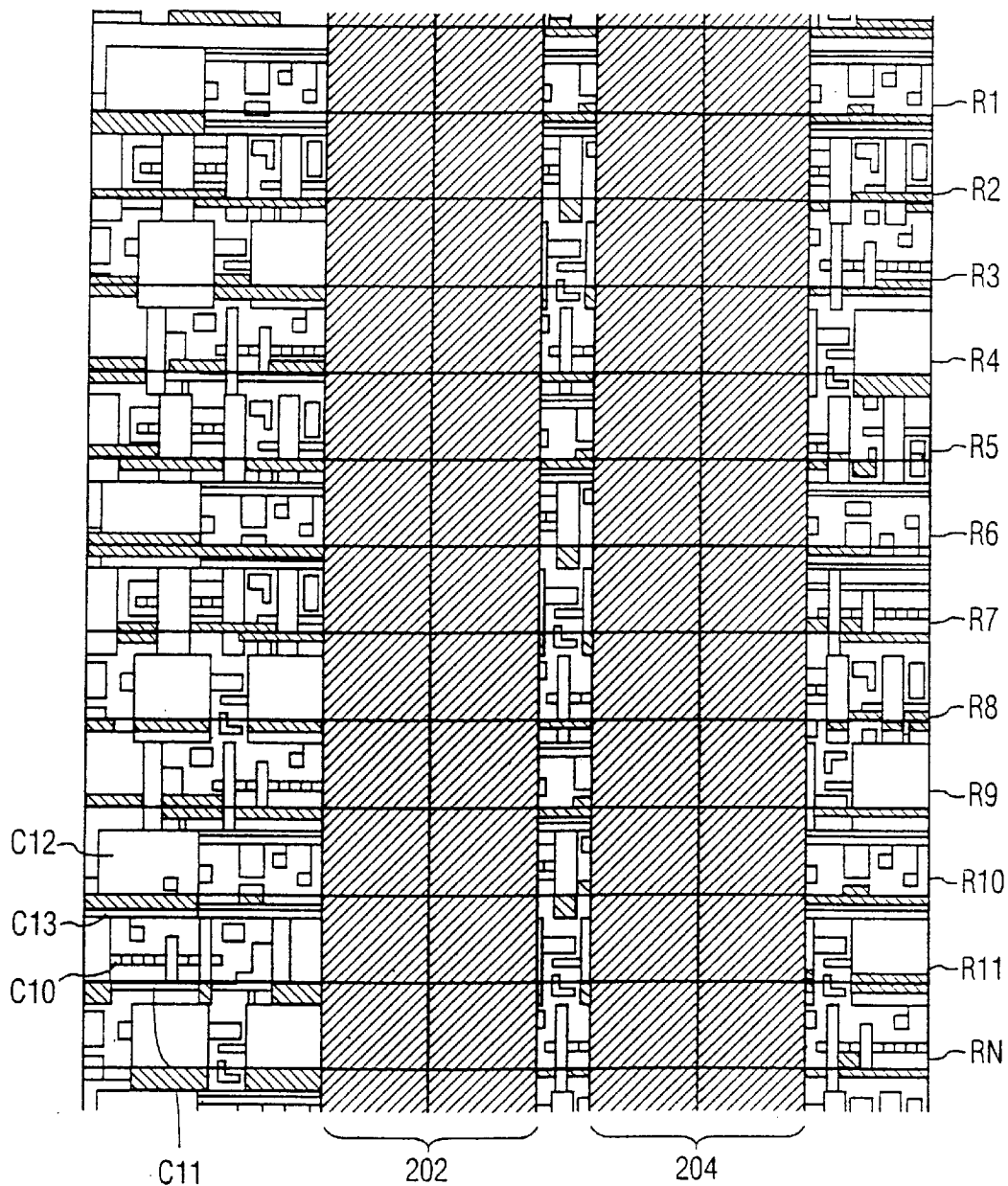
FIG. 3 is a top view illustrating a more realistic view of a block with an increased number of cells, and with stripes in layer 2 blocking the placement of cells thereunder.

The advantages of using higher level layers for power and ground stripes and/or rails is that cells may be placed under the conductors in layers 4 and 5. In the prior art technique, where lower level layers 2 and 3 were used, cells could not be placed under the conductors in layer 2. In the IC of FIGS. 5 and 6, the connection pins for each cell can be easily accessed from any of the low level layers (layers 1, 2, 3). The layout designer can thus place cells under the stripes (e.g. 412, 414, 416, 418), which results in high row utilization. In other words, in any given block there are no continuously extending regions were cells cannot be placed comparable to the loss of cells under layer 2 stripes as in FIG. 3.

At the top level, i.e. the connection of the blocks on the IC, the blocks can easily be connected using a high level layer, such as layer 4 or layer 5 in a five layer system. No rings or rails are needed within the block in low level metals. This is in contrast to the prior art technique, where rings were required due to the impracticability of using stacked vias to make a connection between layer 5 and layer 2, due to physical blocking by signal conductors in the intervening layers 3 and 4.

With the present invention, more stacked vias are present on power and ground stripes than with the prior art technique discussed herein. Where there are stacked vias, cells cannot be placed. However, significant area savings can be achieved with the technique according to the invention, even after accounting for the area consumed by additional stacked vias. The following is the calculation of the area consumed by stacked vias verses a block having horizontal stripes. Consider, for example, a block with a block width of 1200 $\square$m and having 100 rows (1200 $\square$m block height). In the technique according to the invention, the area consumed due to stacked vias is calculated as follows:

$$\text{Area Consumed}[\square m2] = \text{Number of stripes}*[((\text{Number of rows}-2)*2.8) + (1.4*2))*\text{Stripe width}]$$

Suppose the Number of Vertical stripes are 4 for Power and 4 for ground in a 1200 micron wide block and the Stripe Width is 6 microns for each stripe, then the Consumed Area for the stacked vias will be:

$$\text{Area Consumed} = 8 * [((100-2)*2.8) + (1.4*2)) * 6$$

$$= 48 * [(98*2.8) + (2.8)]$$

$$= 48 * 2.8 * 99 = 13305.6 \square m2$$

If, instead, the prior art ring methodology is used in this same block then the area consumed by the 4 horizontal stripes having a width of 6 microns each is as follows:

$$\text{Area consumed}[\square m2] = \text{Block width} * \text{Stripe width} * \text{Number of Stripes}$$

$$= 1200 * 6 * 4 = 28800 \square m2$$

$$\text{Saved area}[[\square m2] = (28800 - 13305)/28800 = 0.52$$

This calculation shows that the area saving by the technique of the invention in comparison to the prior art ring is about 50%. As we increase the width of the block to include more cells, the area consumed by the additional rails of the prior art technique increases faster than area consumed by the stacked vias required by the present invention. When increasing the block width a small amount, it is not necessary to provide extra vertical stripes in the inventive technique, but with the prior art ring methodology it is necessary to put an extra horizontal rail. So, with larger block sizes, the area savings by the invention can be even greater than 50%.

Figure 4:
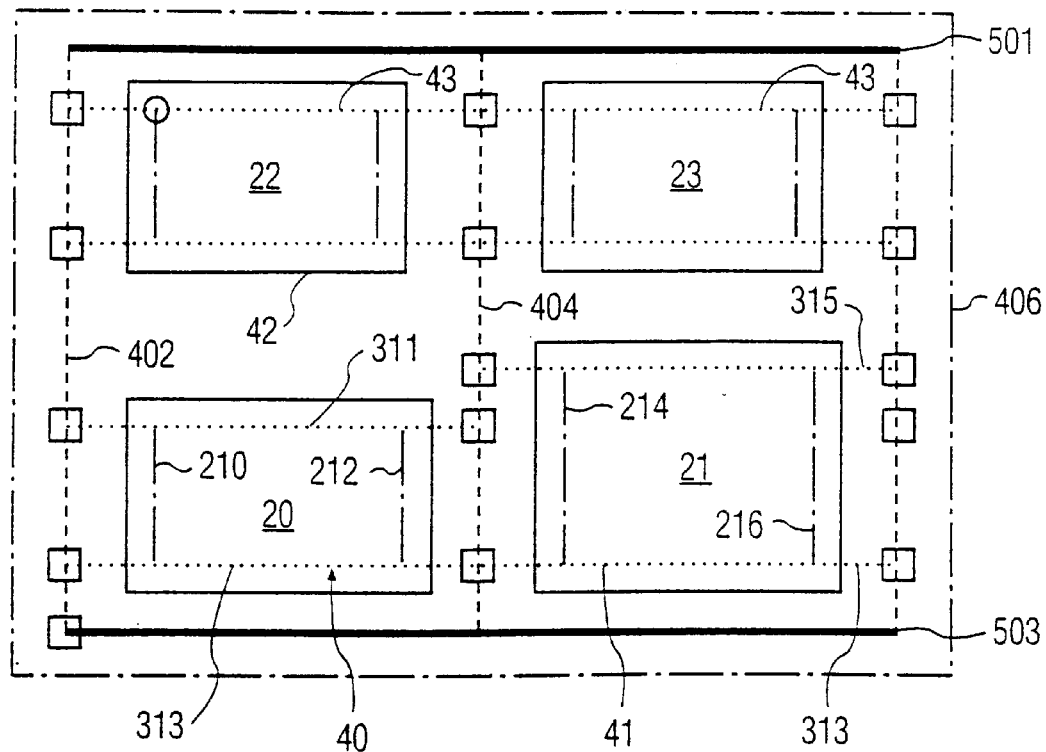
FIG. 4 is a top, diagrammatic view of a portion of an integrated circuit showing a number of blocks of cells with rings in layers 2, 3 for power supply, according to the prior art.

Another advantage is that within each block, power can be supplied more evenly than with the prior art technique which used a ring around the periphery of the block. As is evident from FIG. 5 and FIG. 4, the stripes 412, 414, 416, 418 can be spaced more evenly across the cells in a block, whereas with the known ring power was supplied from the four corners of the power ring and not evenly distributed. Note while this appears similar to the structure of prior art FIG. 2, it is quite different because of the limitations of the stripes 202, 204, 206, 208 with respect to cell loss, whereas the block level stripes in FIG. 4 do not block cell placement. Note also, that since there are no layer 2 conductors for power and ground connections which would interfere with signal routing in layer 2, this layer 2 can now be used entirely for signal routing.

In addition to the area savings and the even power distribution, the technique according to the invention also provides efficiencies with respect to the layout task itself. As previously mentioned, IC's have typically been laid out with a bottom-up approach. According to the present invention, a more advantageous technique is to first lay out the top level design with respect to power and ground conductor routing to the blocks. The design team can thus layout an efficient grid at the top level with the power and ground conductors in layers 4, 5, as shown in FIG. 6. The layer 4 stripes are then transferred to the block level, and fixes the size and placement of the blocks. After fixing block location, the location of the stacked vias for connecting the top level power and ground conductors to the layer 1 power and ground rails is determined. After placing the stacked vias, the signal routing is determined for layers 2, 3, enabling the signal conductors to be routed around the stacked vias. Thus, the layout method according to the invention is the opposite in many respects to the known techniques, and provides greater flexibility in making connections to and between the blocks at the top level, facilitating increased circuit density and lower chip cost.

Example Design Tool Modification

As noted previously, layout of an IC is accomplished with design tools. The examples given herein were designed with the Silicon Ensemble layout tool from Cadence. Implementing the method according to the invention requires over-riding built in intelligience designed into the Silicon Ensemble tool with respect to placement of vias. To put the stacked vias from to layer 5 to layer 1, standard cells must have an "ABUTMENT" property on vdd! and gnd! pins and the following variables should be set to get these stacked vias under Silicon Ensemble:

SET VARIABLE WIRE.SPINS.CONNECTALLGEOMETRIES TRUE;
set var SROUTE.STACKVIASATCROSSOVER true;
set var WIRE.STACKVIASATCROSSOVER true;

These three lines can be placed in envars mac file.
a) Open Silicon Ensemble by using sedsm—m=500 & command.
b) Read all the reuiqred LEF and DEF files of the design.
c) Run Qplace with the following .qpconfig file:
congMode2 false
LLC.prewirekeepOut false
LLC.Ignore.Layer.1 true
LLC.Ignore.Layer.2 true
LLC.Ignore.Layer.3 true
LLC.Ignore.Layer.4 false
LLC.Ignore.Layer.5 true
LLC.Ignore.Layer.6 true
clockBufferSite 0.2
freeTrackpct.1 10
freeTrackpct.2 100
freeTrackpct.3 100
freeTrackpct.4 100
freeTrackpct.5 0
freeTrackpct.6 0 d. Determine power/ground stripe width according to fabrication process to be used.
e. Add power stripes using following command:
add wire net vdd! layer metal4 width <stripe width in sedsm database unit><pt><pt>

Add power and ground stripes in left and right side of the rows. Otherwise tool gives 'Open Info' errors in each row.

f. Run CTGEN and read mapped.def file under sedsm which is created by CTGEN.
g. Add GATE_DECAP and Filler cells.
h. Run Followpins command as follow:
sroute followpins net vdd! layer metal1 width 140 area <pt><pt>
sroute followpins net gnd! layer metal1 width 140 area <pt><pt>

Here selecting area is important because Silicon Ensemble does not stop at power and ground stripes. It extends the wire till the point in the area selection. If the area is larger than required to make the connection to the stripes, the result will be wasted routing tracks that could be useful for metal1 signal routing. Also, Verify Geometry gives Antenna Info. flags. To avoid antenna flags run sroute command for power and ground separately.

i. Run Wroute and complete the routing of other signals.
j. Generate layout.

The above is merely given as an example as to how to implement the method according to the invention with a common design tool. Those of ordinary skill in the art will be able to use other design tools from the general description herein of the IC and the layout method.

Note that since the power ring and ground ring are in separate levels, they may be aligned one above the other, instead of offset as shown in FIG. 5. For example, by making power routing in layer 5 and ground routing in layer 4, but on top of power routing), an additional 10–20% area savings can be realized depending on the size of the IC and the width of the power and ground routing.

The invention is not limited to IC's with five layers, but is applicable to IC's with four or more layers. The benefits of the present invention will be realized when the power and ground conductors at the block level are in the top two levels, irrespective of the number of layers. Thus, if an integrated circuit has $N^{th}$ layers, the power and ground conductors at the block level would be in the N and N-1 layers, with the N layer being the top layer.

Although preferred embodiments of the present invention have been shown and described, it will be appreciated by those skilled in the art that changes may be made in these embodiments without departing from the principles and spirit of the invention, the scope of which is defined in the claims.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

We claim:

1. A method of designing the conductor layout for an integrated circuit, the method comprising:

selecting a plurality of electrically insulated layers of conductors to be placed adjacent to cells that occupy area in a substrate level of the integrated circuit, the plurality of electrically insulated layers including:

a first layer being immediately adjacent to a substrate level, a second layer adjacent the first layer, a third layer adjacent the second layer, and one or more upper layers that are farther removed from the substrate level than the third layer;

the plurality of electrically insulated layers being used to provide power conductors, ground conductors, and signal conductors, placing the power conductors and ground conductors substantially only in a the first layer and the one or more upper layers, thereby allowing the signal conductors to be substantially freely placed in the second layer and the third layer;

placing at least one of the signal conductors in any of the plurality of layers and the power and around conductors in the first layer based on the placing of the power and ground conductors in the upper layers; and placing stacked vias connecting the power and ground conductors of the upper layers to respective power and ground conductors of the first layer.

2. A method according to claim 1, further comprising
   arranging the cells in parallel rows,
   each row having a plurality of cells,
   each cell's borders include opposing edges defining opposing edges of each row, and
   placing the power and ground conductors of the first layer of conductors along the opposing edges of each row.

3. A method according to claim 2, further comprising
   grouping the cells into a plurality of blocks, and
   placing at least one of the power conductors and one of the ground conductors of the upper layers to extend across each block, thereby defining block level power conductors and ground conductors, respectively.

4. A method according to claim 3, further comprising
   placing each of the block level power conductors and ground conductors in each of two of the upper layers.

5. A method according to claim 4, further comprising
   placing a power ring in one of the upper layers, a ground ring in another of the upper layers, and
   connecting the block level power conductors to the power ring and the block level ground conductors to the ground ring.

6. A method according to claim 5, wherein
   the power ring and the ground ring each surround more than one block.

7. A method according to claim 1, wherein
   the power and ground conductors in the upper layers are placed prior to placing the power and ground conductors in the first layer.

8. A method according to claim 1, wherein
   the vias connecting the power and ground conductors of the upper layer to the power and ground conductors of the first level are placed prior to placement of signal conductors.

* * * * *